United States Patent
Costantine et al.

(10) Patent No.: US 10,733,335 B2
(45) Date of Patent: Aug. 4, 2020

(54) RAPID DESIGN OF DEPLOYABLE ANTENNAS FOR CUBESATS

(71) Applicant: STC.UNM, Albuquerque, NM (US)

(72) Inventors: Joseph Costantine, Fullerton, CA (US); Sergio A Pellegrino, Pasadena, CA (US); Maria Sakovsky, Pasadena, CA (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 16/096,494

(22) PCT Filed: May 1, 2017

(86) PCT No.: PCT/US2017/030464
§ 371 (c)(1),
(2) Date: Oct. 25, 2018

(87) PCT Pub. No.: WO2018/017174
PCT Pub. Date: Jan. 25, 2018

(65) Prior Publication Data
US 2019/0138685 A1     May 9, 2019

Related U.S. Application Data

(60) Provisional application No. 62/342,685, filed on May 27, 2016.

(51) Int. Cl.
| | |
|---|---|
| *G06F 30/17* | (2020.01) |
| *H01Q 1/36* | (2006.01) |
| *H01Q 13/02* | (2006.01) |
| *H01Q 1/28* | (2006.01) |
| *H01Q 11/08* | (2006.01) |
| *G06F 30/20* | (2020.01) |

(52) U.S. Cl.
CPC .............. *G06F 30/17* (2020.01); *G06F 30/20* (2020.01); *H01Q 1/288* (2013.01); *H01Q 1/362* (2013.01); *H01Q 11/086* (2013.01); *H01Q 13/0283* (2013.01)

(58) Field of Classification Search
CPC . H01Q 1/28; H01Q 1/22; H01Q 1/288; H04B 17/15; G06F 30/20; G06F 30/17
USPC .............................................. 703/1, 2, 6, 19
See application file for complete search history.

(56) References Cited

U.S. PATENT DOCUMENTS

| | | | |
|---|---|---|---|
| 5,719,794 A | 2/1998 | Altshuler et al. | |
| 10,170,843 B2 * | 1/2019 | Thomson | ............... H01Q 19/19 |
| 10,276,926 B2 * | 4/2019 | Cwik | ......... H01Q 1/08 |
| 2015/0162656 A1 | 6/2015 | Fitz-Coy et al. | |

(Continued)

FOREIGN PATENT DOCUMENTS

| | | |
|---|---|---|
| EP | 2090995 A1 | 8/2009 |
| EP | 3059800 B1 | 8/2018 |

OTHER PUBLICATIONS

Federal Institute of Industrail Property; International Search Report & Written Opinion for PCT/US2017/030464; 5 pages; dated Feb. 7, 2018; Moscow, RU.

*Primary Examiner* — Thai Q Phan
(74) *Attorney, Agent, or Firm* — Keith Vogt, Ltd.; Keith A. Vogt

(57) ABSTRACT

A system and method for designing an antenna wherein a plurality of antenna designs are visually compared using performance metric plots that distinguish between geometries that meet all requirements and designs that do not.

4 Claims, 5 Drawing Sheets

(56) References Cited

U.S. PATENT DOCUMENTS

| | | | |
|---|---|---|---|
| 2016/0352022 A1* | 12/2016 | Thomson | H01Q 19/19 |
| 2017/0110803 A1* | 4/2017 | Hodges | H01Q 1/288 |
| 2018/0106981 A1* | 4/2018 | Reid | G02B 7/1827 |

* cited by examiner

FIG. 1A Dipole

FIG. 1C Conical Horn

FIG. 1B Helix

FIG. 1D CLS

Deployed　　　Flattened　　　Z-Folded

Deployed　　　Flattened　　　Folded

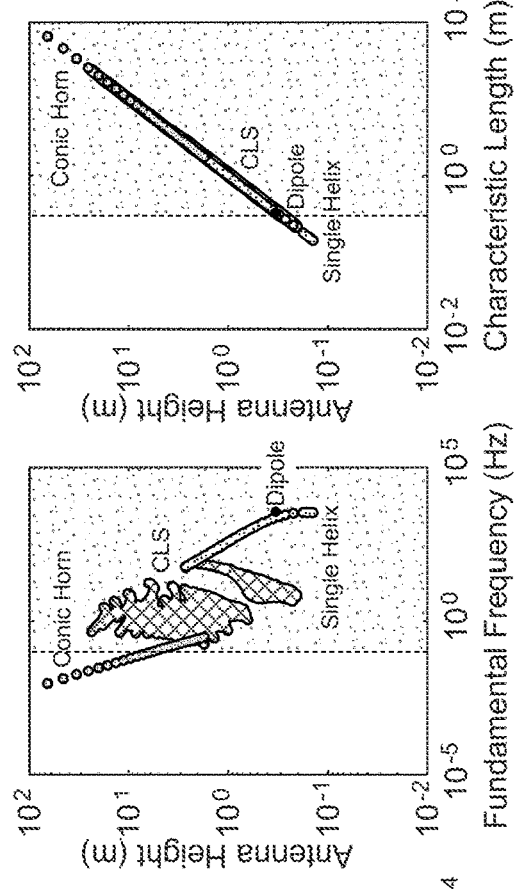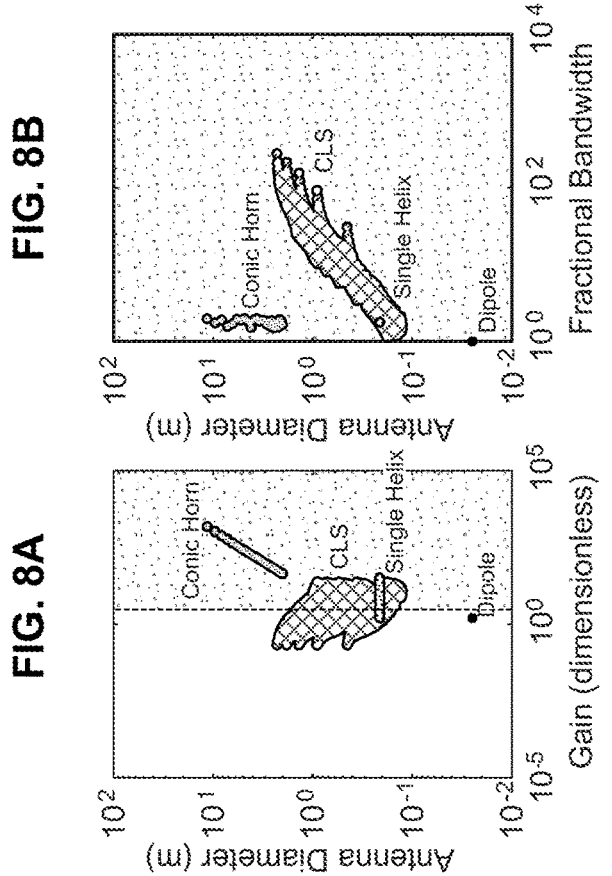

RAPID DESIGN OF DEPLOYABLE ANTENNAS FOR CUBESATS

RELATED APPLICATIONS

This application claims the benefit of U.S. Provisional Application No. 62/342,685 filed May 27, 2016, and herein incorporated by reference.

STATEMENT REGARDING FEDERALLY SPONSORED RESEARCH & DEVELOPMENT

This invention was made with government support under FA9550-13-1-0061 awarded by the Air Force Office of Scientific Research (AFOSR). The government has certain rights in the invention.

BACKGROUND OF THE INVENTION

The recent growth in low-cost access to space through nanosatellites is providing the impetus for increasing the capabilities of these platforms, for example, by increasing the onboard power and downlink rates for applications such as Earth imaging. CubeSats are a very popular platform, available as commercial off-the-shelf kits in sizes that are multiples of the basic 1 U unit, a 10 cm×10 cm×10 cm cube. 3 U CubeSats are currently the most common, with an upward trend towards 6 U.

The limited size of CubeSats imposes strict volume limitations on all subsystems, and particularly on low-frequency antennas, which must be folded for launch within the satellite body and deployed after launch. Popular choices for CubeSat antennas are monopole and dipole antennas; both are available commercially. These can also be combined to mimic circular polarization and thus decrease the pointing accuracy requirement of the satellite. However, these antennas cannot meet the bandwidth and gain requirements imposed by an expanding number of applications. Ongoing research is addressing this gap by identifying specific antenna designs capable of meeting these requirements as well as being packaged in small volumes. A deployable helical antenna developed by the Northrop Grumman Corporation can provide a gain in excess of 10 dB and can be packaged in a 0.5 U CubeSat. Several concepts have been proposed for CubeSat parabolic reflectors including the Ultra-Compact Ka-Band Parabolic Deployable Antenna developed at the Jet Propulsion Laboratory and the mesh reflector developed by BDS Phantom Works.

Designing a deployable antenna requires an optimization of performance subject to a combination of electromagnetic and structural constraints. The estimation of electromagnetic performance is usually carried out with numerical simulators, such as Ansys Electronics Desktop, CST and Feko. However, such a process can be quite lengthy if the design space is large, as there are no tools to carry out rapid performance evaluations and comparisons between various concepts. Designer interfaces that include a catalog of various antenna structures have been added to several simulation tools, such as the Antenna Magus tool, an add-on interface to CST and Feko, and the Ansys HFSS Antenna Design Kit. Even with these aids, electromagnetic one-by-one performance evaluation and concept comparison must still be carried out by the designer. Also, geometrically non-linear structural simulations are carried out, usually with finite element software such as Abaqus.

In the structures and materials community, existing databases of material properties allow mechanical engineers to quickly compare material performance. An example is the CES selector which compares materials by graphically representing their performance according to different metrics. These tools are limited to material selection for standard structural problems and do not consider deployment concepts, which is a critical shortcoming addressed by the embodiments of present invention.

BRIEF SUMMARY OF THE INVENTION

In one embodiment, the present invention provides a novel methodology for coupled electromagnetic and structural design of antennas.

In another embodiment, the present invention provides a novel methodology for coupled electromagnetic and structural design of antennas for CubeSats.

In another embodiment, the present invention provides a technique for graphical representation of antenna performance as a function of geometry using a set of two-dimensional plots.

In another embodiment, the present invention allows many antenna concepts to be directly compared to each other using a plurality of performance metrics.

In another embodiment, the present invention allows many antenna concepts to be directly compared to each other using performance metric plots that allow the designer to narrow down the design space to antenna geometries that meet all requirements.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings generally illustrate, by way of example, but not by way of limitation, a detailed description of certain embodiments discussed in the present document.

FIG. 1A shows a dipole design. FIG. 1B shows a conical horn. FIG. 1C shows a helix design. FIG. 1D shows a CLS design.

FIGS. 8A, 8B, 8C, 8D, 8E, 8F, 8G and 8H provide a selection chart for the design of a high-performance UHF antenna operating at 450 MHz that folds in a 3 U CubeSat, as an example of the methodology described here.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

In one embodiment, the present invention provides a novel methodology for designing antennas. The space for the antenna design problem is defined as the set of antenna geometries that result in acceptable electromagnetic operation for each considered antenna. For this embodiment of the present invention, a set of geometric parameters, common to all antennas under consideration, may be used to define a constraint space. The geometry of the considered antennas is parametrized as a function of their height, h, and their largest diameter, D. The electromagnetic and structural performance can then be computed as a function of these parameters.

The proposed rapid design methodology, for a preferred embodiment of the present invention, consists of the following five steps. 1) Identifying a set of antenna concepts that are relevant to the particular application that is of interest. 2) For each selected antenna type, identifying one or more structural architectures and, for each architecture, proposing a packaging scheme. 3) Obtaining, for each antenna type, design relationships between the basic geometric parameters of the antenna and the corresponding RF performance parameters (gain, bandwidth) and structural performance parameters (fundamental vibration frequency, characteristic length of packaged structure). 4) Generating graphical representations of the design space, through plots of each geometric design parameter vs. all performance parameters, including all considered antenna types. 5) Blocking off those parts of the design space that do not meet one or more requirements and searching for a range of geometric design parameters that allows all requirements to be met, for each of the selected antenna types.

In other embodiments, the methodology of the present invention may be applied beyond deployable antennas for a specific type of application. However, as an exemplar, an embodiment of the present invention that is directed at a specific case of antenna types and deployment schemes that were recently developed for CubeSats is discussed below.

Figure 1:
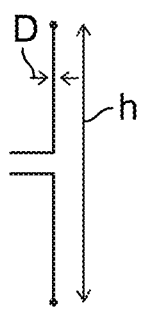
FIGS. 1A, 1B, 1C and 1D illustrate the geometries of 4 antennas used with the embodiments of the present invention.
Figure 1:
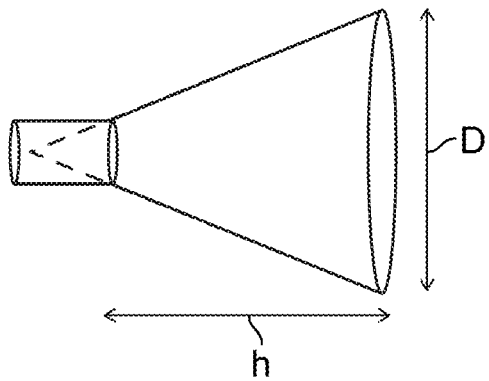
Figure 1:
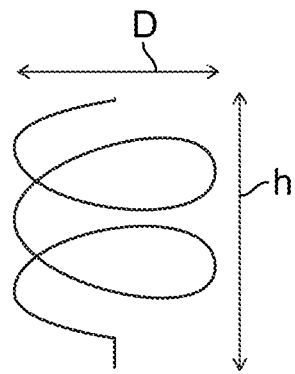
Figure 1:
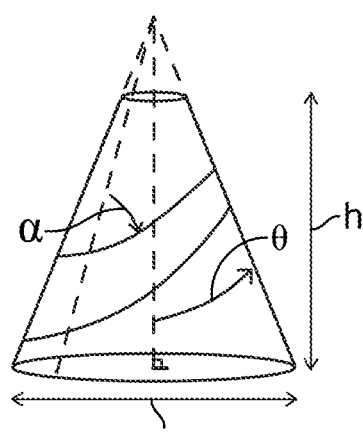
Figure 2:
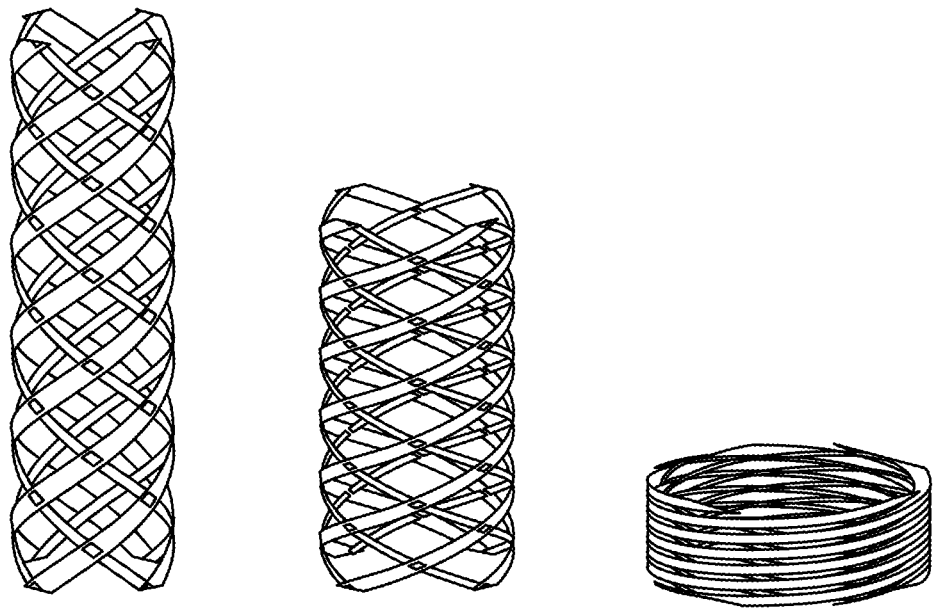
FIG. 2 shows a helical pantograph consisting of 4 left-handed and 4 right-handed helices from fully developed (left view), partially folded (middle view) and fully folded (right view).
Figure 3:
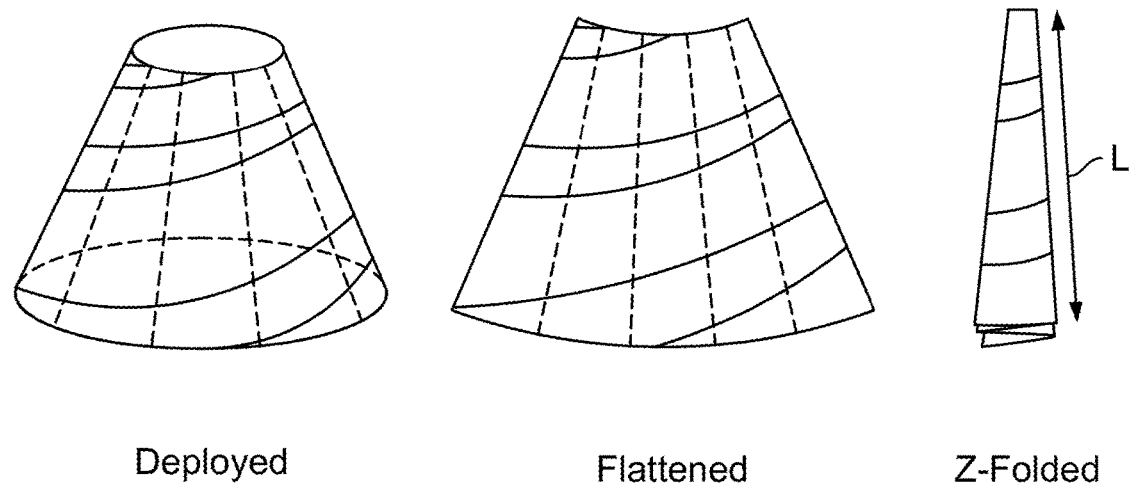
FIG. 3 illustrates a dual-matrix composite shell antenna shown fully deployed (fold lines are shown as dashed), flattened, and fully compacted.
Figure 4:
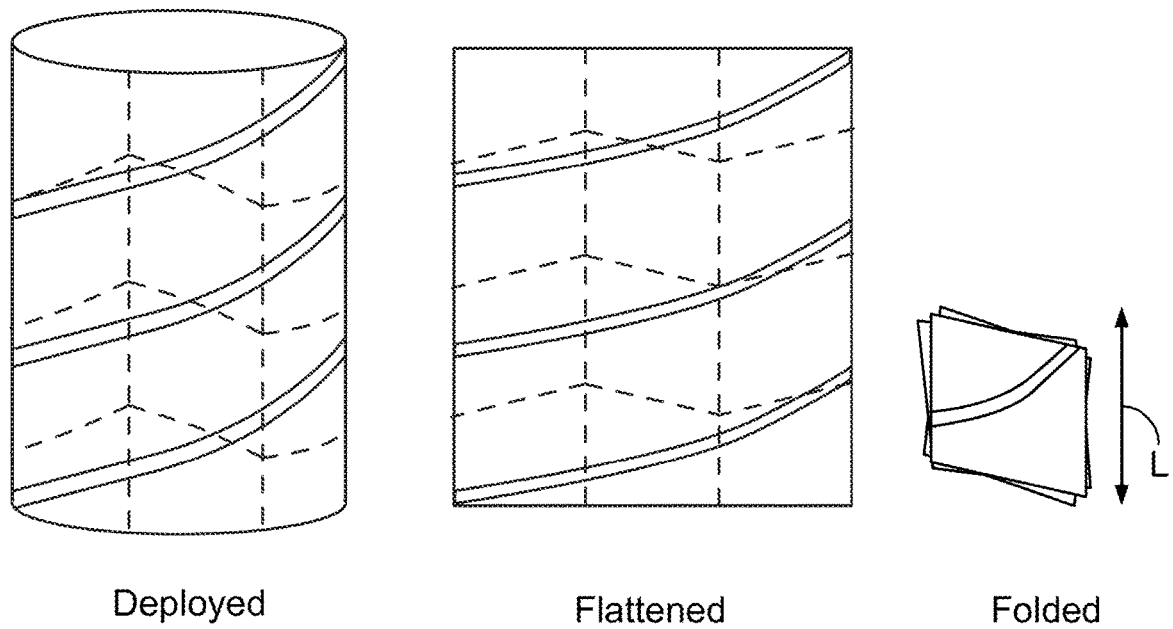
FIG. 4 illustrates a variant of a dual-matrix composite shell antenna shown fully deployed (fold lines are shown as dashed), flattened, and fully compacted.

FIG. 1 schematically shows four antennas, among others, that may be designed using the various embodiments of the present invention. Shown are a half-wavelength dipole, a helix, a conical log spiral (CLS), and a conical horn. The half-wavelength dipole has been selected for performance comparison, as it is already a widely-used antenna on CubeSats and can be considered as the fundamental antenna. The helical and CLS are good candidate for UHF frequency bands. Other antenna configurations which may be designed in accordance with the embodiments of the present invention include, but are not limited to, patch, reflector, and yagi-uda. The conical horn antenna has been chosen to cover operation at higher frequency bands.

For the half-wavelength dipole, there is a unique design for each wavelength, $\lambda$, with the height, h, given by, $$h = \frac{\lambda}{2} \tag{1}$$

For this embodiment of the present invention, the length of the dipole is redefined as the dipole height for consistency with other antenna concepts.

Constraints for the helix are derived from desired operation in the end-fire mode with circular polarization. The main geometry design parameters are the diameter, conductor pitch, and number of turns of the helix, which can be expressed in terms of only diameter and height, $$D = \frac{\lambda}{\pi} \tag{2}$$

$$\frac{3\lambda}{4} \tan 12° < h < 20\lambda \tan 14° \tag{3}$$

Regarding the conical horn antenna, its geometry is defined such as to minimize antenna losses. This results in a set of constraints on the cone angle, base circle diameter, and slant height, which can be expressed in terms of only the height and largest diameter of the cone, $$\tan 5° < \frac{D}{2h} < \tan 30° \tag{4}$$

$$h^2 = \left(\frac{D^2}{3\lambda}\right)^2 - \left(\frac{D}{2}\right)^2 \tag{5}$$

For the CLS there is no simple set of equations that define the range of available geometries. Consequently, for this embodiment of the present invention, experimental data is parametrized in terms of the cone angle, $\theta$, and wrap angle of the conductors around the cone, $\alpha$. Constraints on these parameters, to achieve a directional radiation pattern, are:

$$2° < 2\theta < 45° \tag{6}$$

$$45° < \alpha < 90° \tag{7}$$

Given $\theta$ and $\alpha$, the upper and lower radii of the cone, and its height can then be obtained from the same experimental data. Equivalently, the geometry can be expressed in terms of h and D.

Structural architectures that allow efficient packaging have been proposed; most of them were developed specifically for CubeSat antennas. A simple architecture, suitable for the dipole antenna, is a single mechanical hinge supporting a stiff conducting element. The hinge allows the conducting element to be folded parallel to the wall of the CubeSat. A simpler and popular alternative is the metallic tape-spring (i.e., a structure similar to a tape measure) that is elastically bent near the root to fold the rest of the tape spring parallel to the CubeSat. Tape springs can also be used to fold linear arrays such as the Yagi-Uda antennas.

A more complex architecture, suitable for the helix antenna, is a cylindrical lattice structure of nonconducting, structural heli-ces connected to conducting helices by scissor joints. This structure behaves as a helical pantograph and therefore has a soft deformation mode that allows axial compaction. Alternatively, helical conductors can be supported at the base and compacted axially via rotation, resulting in coiling of the conductors around the base. Another approach uses dual-matrix composite thin shells made from laminated thin sheets of continuous quartz fibers embedded in two different plastic materials—a stiff epoxy resin and a soft elastomer—that support a set of embedded conducting elements. The regions with soft elastomer matrix form hinge regions arranged according to an origami fold pattern that allows the shells to be folded tightly without damaging the fibers. Compaction in a single direction can be achieved using the Z-folding pattern, and compaction in two directions can be achieved using the Miura-Ori origami pattern.

Parabolic reflector antennas require unique packaging schemes due to the doubly curved surface of the main dish. Typically, these consist of a mesh conductor shaped by supporting curved ribs. The ribs can be rigid with several hinges allowing them to fold alongside a central hub supporting the antenna feed. Alternatively, the ribs can be elastic, allowing the mesh to wrap around the central hub using an origami packaging scheme.

Table I summarizes the antenna concepts used in connection with the various embodiments of the present invention.

Once the geometry of a set of predetermined antennas has been parametrized in terms of no more than two common parameters, h and D, the performance of each antenna may be predicted. The electromagnetic performance is characterized by three geometry-dependent metrics: the maximum antenna gain, the fractional bandwidth (defined as the ratio of the highest to the lowest operating frequency), and the polarization. These metrics can be computed from textbook equations and experimental data. The fractional bandwidth of the horn antenna was derived from the performance range of available off-the-shelf antennas.

These results are summarized in Table II. The electromagnetic performance of the chosen antennas also depends on non-geometric parameters, including material properties, feeding technique, and various other factors. However, for certain embodiments of the present invention, it is acceptable to predict performance based only on the geometry of the antenna, making specific, although preliminary assumptions, about these various effects, is sufficient.

TABLE 1

A SUMMARY OF ANTENNA AND DEPLOYMENT ARCHITECTURES USED IN THE PRESENT STUDY.

|  | Hinge | Tape-Springs | Helical Pantographs | Z-Folded Shells | Miura-Ori Shells | Coilable Conductors | Hinged Ribs | Wrapped Mesh |
|---|---|---|---|---|---|---|---|---|
| Dipole | X | X |  |  |  |  |  |  |
| Helix |  |  | X | X | X | X |  |  |
| CLS |  |  |  | X | X |  |  |  |
| Horn |  |  |  | X | X |  |  |  |
| Patch |  |  |  |  |  |  |  |  |
| Reflector |  |  |  |  |  |  | X | X |
| Yagi-Uda |  | X |  |  |  |  |  |  |

A metric for the structural performance of a deployable structure is its ability to achieve and maintain its deployed configuration, which is best captured by the stiffness of the deployed structure in its softest mode of deformation. The fundamental frequency of vibration in the deployed configuration captures this effect and hence is a design metric. Regarding the packaging performance of each chosen antenna, with its associated structural architecture and packaging scheme, it is characterized by a characteristic length of the packaged structure, defined as the maximum length in the folded configuration, and the packaging ratio, defined as the volume enclosed by the deployed structure, divided by the volume enclosed by the folded structure. The packaging performance associated with a given folding scheme may also be characterized by the dimensions of the envelope of the folded structure. In addition, a packaging ratio may be used to measure the ratio of the enclosed volumes in the deployed and folded configurations.

A summary of the equations used to compute performance metrics is presented in Table III. The fundamental frequency of vibration of each antenna has been approximated using available equations. The characteristic length and packaging ratios may be derived or computed directly.

The electromagnetic metrics depend on the wavelength, height, and diameter of the antenna. For certain embodiments of the present invention, the remaining parameters for the structural metrics were all taken to be constant and equal to values specific to existing antenna prototypes. These include the Young's modulus, E, Poisson's ratio, ν, and linear/areal density of the conductors/thin shells, ρ, the number of turns in the helical pantograph, N, the number of panels in the Miura-Ori packaging scheme, i,j, along the axis and the circumference of the antenna, and the internal panel angle, φ, and the width of the helices forming the helical pantograph, a.

Figure 5:
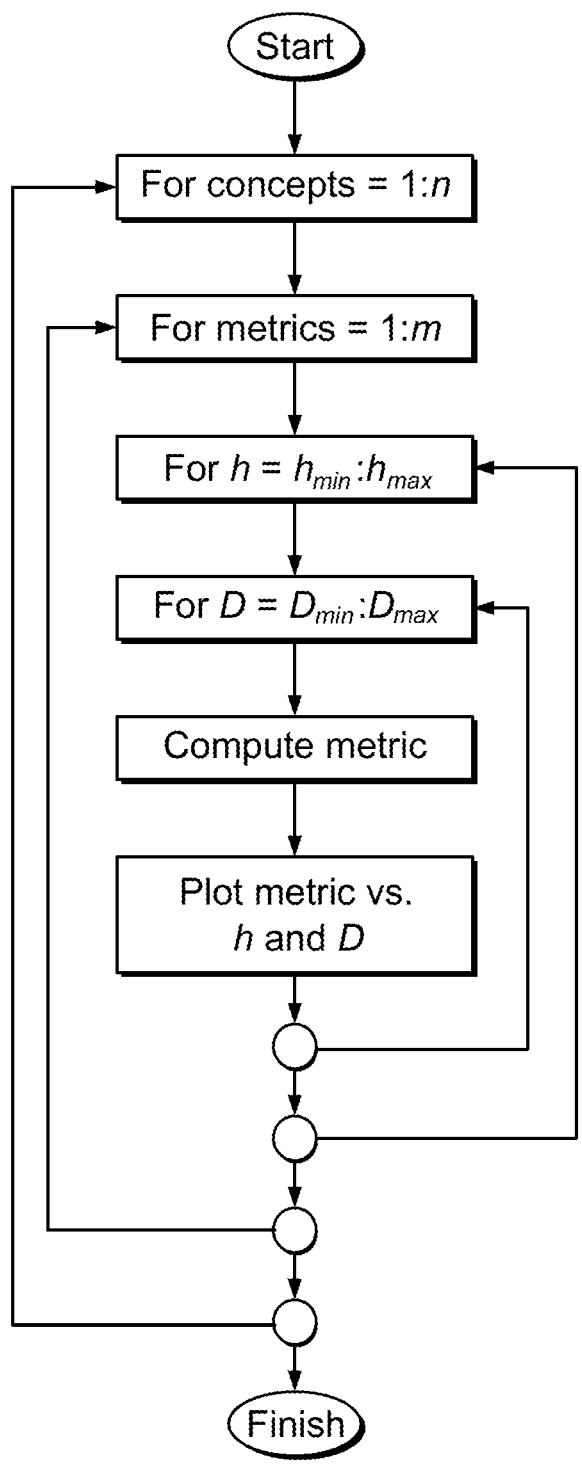
FIG. 5 is an algorithm for estimating antenna performance for use with various embodiments of the present invention.

The design problem is formulated as follows. Given a desired operating frequency for the antenna, f, the corresponding wavelength may be calculated. Then a set of n antenna concepts is selected, and m performance metrics are compared for each antenna concept by computing the metrics within four nested for loops, as illustrated in FIG. 5. The limits $h_{min}$, $h_{max}$, $D_{min}$, and $D_{max}$ are computed for each antenna concept using the limits presented in the Antenna Types section, and the metrics are evaluated using the equations in Tables II and III.

TABLE 2

THE DESIGN EQUATIONS FOR ELECTROMAGNETIC PERFORMANCE METRICS.

| Antenna Type | Gain, G | Fractional Bandwidth, BW (%) | Polarization |
|---|---|---|---|
| Half-wavelength dipole | 1.643 | 3 | Linear |
| Single helix | $\dfrac{15(\pi D)^2 h}{\lambda^3}$ | 56 | Circular |
| CLS | Interpolated from experimental data in [15] | Interpolated from experimental data in [15] | Circular |
| Conical horn | $20\log\left(\dfrac{\pi D}{\lambda}\right) - \ell;\ \ell = 2.912$ for optimum | $40 < BW < 75$ | Linear/circular |
| Patch | $\dfrac{2}{15 G_{rad}}\left(\dfrac{D}{\lambda}\right)^2$ | $\dfrac{\epsilon_r - 1}{\epsilon_r^2}\dfrac{Dt}{h}$ | Linear/circular |
| Reflector | $\left(\dfrac{\pi D}{\lambda}\right)^2 \epsilon_{2p}$ | $5 < BW < 10$ | Various |
| Yagi-Uda | Interpolated from experimental data in [20] | Interpolated from experimental data in [20] | Linear |

TABLE 3

THE DESIGN EQUATIONS FOR STRUCTURAL PERFORMANCE METRICS.

| Antenna Type | Folding Scheme | Packaged Dimensions, $L_1, L_2, L_3$ | Packaging Ratio, p | Fundamental Frequency, $f_0$ |
|---|---|---|---|---|
| Dipole | Hinge | $L_1 = h;\ L_2 = L_3 = D_{wire}$ | 1 | $\dfrac{3.516}{2\pi h^2}\sqrt{\dfrac{EI}{\rho_l}}$ |
| | Tape-springs | $L_1 = \dfrac{h}{i};\ L_2 = L_3 = D_{wire}$ | | |
| Helix | Helical pantographs | $L_1 = L_2 = 2\sqrt{\left(\dfrac{D}{2}\right)^2 + \left(\dfrac{h}{N}\right) - \left(\dfrac{a}{2\pi}\right)}$ $L_3 = \dfrac{3}{2} h D_{wire}$ | $\dfrac{D^2 h}{2ND_{wire}L_1}$ | $\dfrac{D_{wire}}{4\pi D^2 N}\sqrt{\dfrac{E}{\rho(1+v)}}$ |
| | Coilable conductors | $L_1 = 2ND_{wire}$ $L_2 = L_3 = \dfrac{1}{\pi}\sqrt{(\pi D)^2 + \left(\dfrac{h}{N}\right)^2 - 4D_{wire}^2}$ | $\dfrac{D^2 h}{L_1 L_2^2}$ | |
| | Z-folding | $L_1 = h;\ L_2 = \dfrac{\pi D}{i};\ L_3 = 3ti$ | $C_1 D$ $C_1 = 50\ m^{-1}$ | $\dfrac{3}{8\pi}\dfrac{h}{D}\sqrt{\dfrac{E}{\rho_a(1v^2)}}$ |
| | Miura-Ori | $L_1 = L_2 = \dfrac{\pi D}{2i};\ L_3 = \dfrac{\pi D}{2i}\tan\phi + \dfrac{h}{j}$ | | |
| Conic horn/CLS | Z-folding | $L_1 = g\left[1 + \left(\dfrac{D\cot\theta}{2h} - 1\right)\left(1 - \cos\dfrac{\theta_0}{2i}\right)\right]$ $L_2 = 2g\dfrac{D\cot\theta}{2h}\sin\dfrac{\theta_0}{2i};\ L_3 = 3ti$ $g = h\sqrt{\tan^2\theta = 1}\ ;\ \theta_0 = \dfrac{\pi h \tan\theta}{g}$ | $C_2 \dfrac{Dh}{\sqrt{h^2 + \dfrac{D^2}{4}}}$ $C_2 = 133\ m^{-1}$ | $\dfrac{2h}{\sqrt{15\pi D^2}}\left(3 - 4\sin\left(\dfrac{3\theta}{4}\right)\right)\sqrt{\dfrac{E}{\rho(1-v^2)}}$ where $\tan\theta = \dfrac{D}{2h}$ |

TABLE 3-continued

THE DESIGN EQUATIONS FOR STRUCTURAL PERFORMANCE METRICS.

| Antenna Type | Folding Scheme | Packaged Dimensions, $L_1, L_2, L_3$ | Packaging Ratio, p | Fundamental Frequency, $f_0$ |
|---|---|---|---|---|
| | Miura-Ori | $L_1 = L_2 = \frac{\pi D}{2i}$ | | |
| | | $L_3 = \frac{\pi D}{2i}\tan\phi + \frac{1}{j}\sqrt{h^2 + \frac{D^2}{4}}$ | | |
| Patch | Fixed | $L_1 = h; L_2 = D; L_3 = t$ | 1 | $\frac{a}{2\pi h^2}\sqrt{\frac{(Et)^3}{12\rho(1-v^2)}}$ |
| | | | | $a = f\left(\frac{h}{D}\right)$ can be found in [19] |
| Reflector | Hinged ribs | $L_1 = L_2 = \frac{D}{10}$ | $\frac{D^2 h}{L_1^2 L_3}$ | $\min\left(\frac{2t^2}{\pi h^3}\sqrt{\frac{E}{\rho}}\frac{g_1}{g_2}, \frac{3}{8\pi}\frac{h}{D_{hub}}\sqrt{\frac{E}{\rho_{hub}(1+v)}}\right)$ |
| | | $L_3 = \frac{h}{2}\tan^{-1}\left|\frac{\frac{h}{2D}}{\left(\frac{h}{D}\right)^2 - \frac{1}{16}}\right|$ | | $\frac{g_1}{g_2} = f(\theta_0)$ can be found in [14] |
| | Wrapped mesh | $L_1 = \frac{\pi D}{i}$ | $\frac{iDh}{4L_2^2}$ | |
| | | $L_2 = L_3 = D_{hub} + 3t\cot\frac{\pi}{i}$ | | |
| Yagi-Uda | Tape-springs | $L_1 = D_{wire}(\pi + 2)$ | $\frac{2hD}{D_{wire}^2(\pi+2)}$ | $\frac{0.621}{h^2}\sqrt{\frac{E(tD)_{wire}^3}{\pi\rho_l}}$ |
| | | $L_2 = \frac{\pi}{2}D_{wire}; L_3 = D_{wire}$ | | |

To facilitate the comparison of the various antennas, the performance metrics of each antenna are computed as a function of the antenna geometry parameters, h, and D. In a preferred embodiment, processing speed may be enhanced through coarser discretization of the range of h and D for each antenna.

Figures 6, 7:
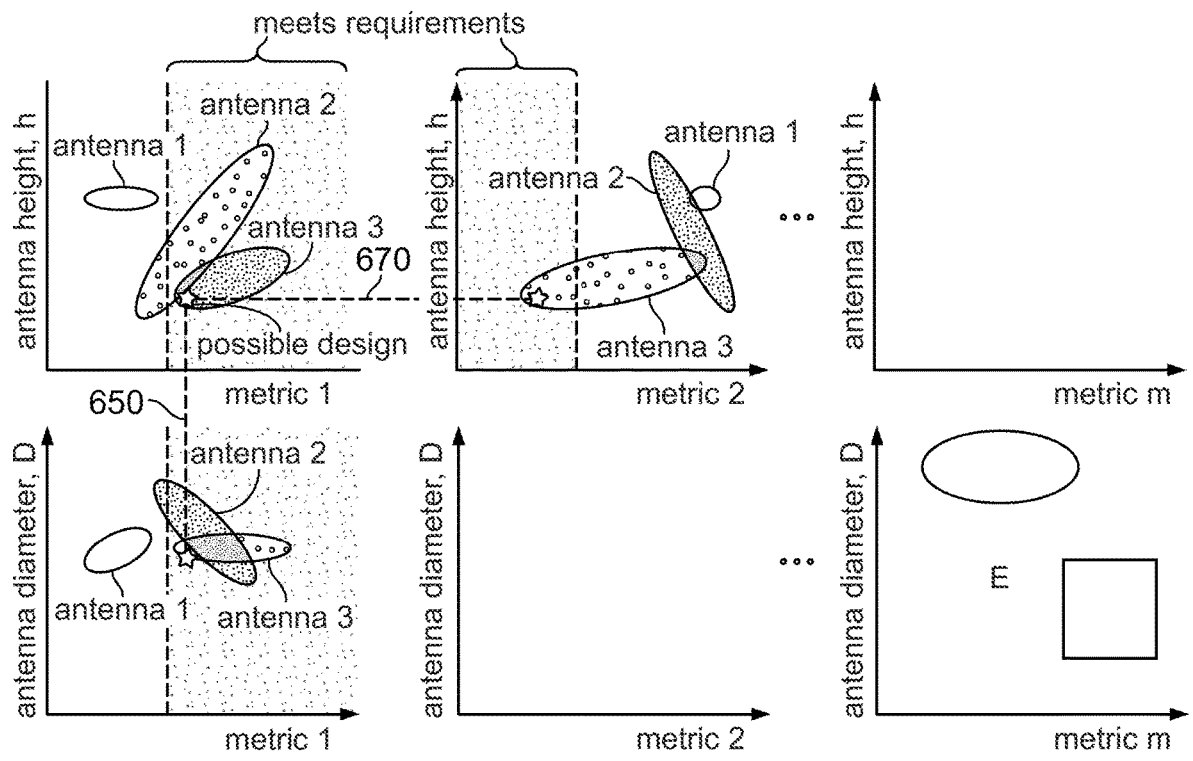
FIG. 6 provides a schematic chart for comparing antenna performance for use with various embodiments of the present invention. Ellipses represent achievable performance for a specific design concept. Stars represent a specific design.
FIG. 7 is selection tool input screen for use with embodiments of the present invention.

The algorithm in FIG. 5 generates the set of plots shown in FIG. 6.

The layout of these plots is as follows. Plots 600 and 610 in the top row show the range of each performance metric that can be achieved, for each antenna (antenna 1, antenna 2, and antenna 3) by varying the antenna height. Similarly, the plots in bottom row show the effects of varying the antenna diameter. For each antenna, the locus of achievable performance has been shown as elliptical regions 601-603, 611-613 and 621-623. Although other shapes may be formed and in fact may even be non-convex or disjointed. In a preferred embodiment, the present invention is configured to display the visual output so that moving across FIG. 6, the y-axis value remains constant, whereas moving down, the x-axis 670 remains constant. This allows tracking a particular design of a chosen antenna across the whole chart, as illustrated by means of stars 605, 615 and 625 in FIG. 6 which are shown as remaining on the x and y-axis.

In each plot, rectangle 608, 618 and 628 has been used to identify the region of antenna performance that satisfies a prescribed requirement for that particular metric, assuming that all requirements are in the form of a single inequality.

Those parts of the elliptical loci that lie within the shaded region in a particular plot represent designs that satisfy the requirements for the corresponding metric. By looking across several plots, as well as up and down, a designer can find subsets of the design space that meet the requirements on all metrics.

For example, one can start in the top left corner of FIG. 6 in plot 600 and select antenna heights that meet the requirements for metric 1, for each antenna concept. Then one moves across the top row, selecting allowable antenna heights for metrics 2 through m. The intersection of the antenna height ranges that meet each separate requirement provides a range of antenna heights that meet all of the requirements. The same can be done for the bottom row of FIG. 6, to determine antenna diameters meeting all of the requirements. Thus, the final result is a set of antennas that are capable of meeting all requirements, and also a corresponding narrow range of antenna geometries, parameterized in terms of h and D, that can be used for a follow-on, detailed optimization.

In other embodiments, the present invention provides a design tool developed in Matlab to automate the selection process. The tool provides a user interface where requirements are entered for the design problem and the antenna concepts to be compared, as shown in FIG. 7.

The tool allows for a comparison among an arbitrary number of parameters. Different antenna types or a single antenna may be compared with several different folding schemes. The addition of new antenna concepts is straightforward and can be done by the addition of standalone functions that compute performance metrics for the concept. The addition of the new concept to a global list automatically adds it to the interface.

The present tool reduces the selection and comparison time needed before finalizing the constraint satisfying design. This allows a user to select and compare various antenna topologies against multiple deployment approaches, before selecting an optimal solution that will then be modeled using any of the numerical simulators available for detailed radiation characteristic and electromagnetic performance evaluation.

A study of a UHF antenna operating at 450 MHz was performed to compare several potential antenna concepts and their deployment schemes. The antenna concepts compared were: 1) Half-wavelength dipole deployed using a mechanical hinge. 2) Single helix deployed using z-folding. 3) CLS antenna deployed using z-folding. 4) Conical horn deployed using z-folding. The design objective was to satisfy the following requirements:
1) Operation at 450 MHz 2) Gain higher than 5 dB (=3.16 dimensionless).
3) Fundamental frequency is higher than 0.1 Hz. 4) Folded antenna can fit into a 3 U CubeSat (the characteristic length is less than 30 cm). 5) The design maximizes bandwidth.

These requirements define a coupled electromagnetic and structural design problem appropriate for resolution by the various embodiments of the present invention. The geometric constraints on height and diameter have been calculated from Equations 1, 2-3, 4-5, 6-7, respectively for the the four antennae and are given in column 2 of Table IV.

TABLE IV

DESIGN AND OPTIMIZATION SPACES FOR UHF CASE STUDY

| Antenna Architecture | Original Design Space (m) | Optimization Space (m) |
|---|---|---|
| Dipole hinge | h = 0.33<br>D = 0.025 | Does not meet requirements |
| Single Helix z-folding | 0.012 < h < 3.32<br>D = 0.21 | 0.22 < h < 0.27<br>D = 0.21 |
| Conical Horn z-folding | 1.73 < h < 65.53<br>2.00 < D < 11.47 | Does not meet requirements |
| CLS z-folding | 0.21 < h < 23.40<br>0.13 < D < 2.27 | 0.21 < h < 0.27<br>0.20 < D < 0.30 |

As shown, for the CLS antenna the constraints on h and D have been obtained by interpolating experimental data for the set of 0, a given in Equations 6.

The gain, fractional bandwidth, fundamental frequency of vibration, and characteristic length are computed for each antenna, from the equations in Table II and III, for the full range of geometric parameters. These parameters are plotted against the antenna height and diameter as described in Section II-D and the results are shown in FIGS. 8A-8H.

To select specific antenna architectures that meet all requirements, start from plot shown in FIG. 8A. This plot allows the designer to specify the gain requirements; in the present case, the gain should be higher than 5 dB and hence the region with dimensionless gain ≥3.16 has been shaded gray in the plot. As shown, the locus for the dipole antenna (which is a single point 810) falls outside the shaded area, indicating that the half-wavelength dipole does not meet the gain requirement. The entire locus for the conical horn antenna falls inside the shaded area. Hence it meets the gain requirement. Regarding the loci for the single helix and the CLS, only subsets of these loci fall within the shaded area. The height ranges corresponding to these subsets identify viable CLS antennas, with any height, and helical antennas with 0.22<h<3.32 m.

Moving to the right from FIG. 8A, the same process can be repeated for the plots shown in FIGS. 8B-8D. The plot shown in FIG. 8B imposes no new constraints on the design as no requirement has been specified for the bandwidth. However, it can be seen that the CLS antenna would maximize the available fractional bandwidth. In the plot the shown in FIG. 8C, the fundamental frequency of vibration requirement has been set by shading the region with $f_0$>0.1 Hz. It is then found that only conical horn antenna heights in the range 1.4<h<3.2 m are allowed, whereas there is no limitation on the helical and CLS antennas. Proceeding to the plot shown in FIG. 8D and introducing the constraint on characteristic length, corresponding to shading the region ≤0.3 m, eliminates the conical horn antenna (indicating that the chosen packaging scheme is not acceptable). Of the remaining two viable concepts, the characteristic length requirement is met by helical antennas with 0.012<h<0.27 m and CLS antennas with 0.21<h<0.27 m.

An analysis of the first row of plots shown in FIGS. 8A-8D has led to the conclusion that the dipole and conical horn antennas cannot meet all of the stated requirements. Since all requirements in the form of inequalities have been considered, there are no further requirements to be considered and hence no further reductions in the space of viable designs. Hence the design optimization space, presented in column 3 of Table IV, shows the height limits of the only two viable concepts.

At this point, an analysis similar to that described above, but using the bottom row of plots shown in FIGS. 8E-8H, provides the range of viable diameters for the helical and CLS antennas. The outcome of this further analysis is the diameter range presented in column 3 of Table IV.

A significant reduction of the initially considered design space to the optimization space shown in Table IV has been achieved and at this point detailed simulations could be carried out to complete the design optimization. FIGS. 8A-8H can also be used to select a specific design that "optimizes" one specific metric. This is the case with the 5th requirement for this design, stating that the bandwidth should be maximized. Considering the plots shown in Figure BB and FIG. 8F, it is clear that for the optimization space defined in Table IV, the CLS antenna provided the largest bandwidth and the specific design that corresponds to the optimum in these plots has h=0.27 m and D=0.20 m.

In other embodiments, the present invention provides a methodology for the rapid preliminary design of deployable antennas for CubeSats that use a novel visual representation method of antenna performance consisting of a coordinated set of plots of antenna performance metrics against the basic antenna geometry parameters and can easily address coupled electromagnetic and structural design problems. This approach enables rapid and direct comparison of antenna concepts and allows a user to identify concepts with the potential to meet requirements and to narrow down the design space, before attacking the problem with detailed numerical simulations.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiments, methods, and examples, but by all embodiments and methods within the scope and spirit of the disclosure.

What is claimed is:

1. A system for designing an antenna comprising:
a processor adapted to identify a set of antenna concepts that are relevant to a particular application that is of interest;
said processor further adapted to, for each selected antenna type, identify one or more structural architectures and, for each architecture, providing a packaging scheme;
obtaining, for each antenna type, design relationships between basic geometric parameters of the antenna and one or more performance parameters and one or more structural performance parameters;
said processor adapted to generate a graphical representations of a design space, through plots of each geometric design parameter as compared to performance parameters, including considered antenna types; and
said processor adapted to block off those parts of the design space on the graphical representation that do not meet one or more requirements and searching for a range of geometric design parameters that allows all requirements to be met, for each of the selected antenna types.

2. The system of claim 1 wherein the graphical representation shows antenna performance as a function of geometry using one or more two-dimensional plots.

3. The system of claim 1 wherein performance parameters correspond to radio frequency, gain, or bandwidth.

4. The system of claim 1 wherein structural performance parameters include fundamental vibration frequency or the characteristic length of the packaged structure.

* * * * *